(12) United States Patent
Aoki et al.

(10) Patent No.: US 12,267,947 B2
(45) Date of Patent: Apr. 1, 2025

(54) WIRING BOARD, ELECTRONIC MODULE, AND ELECTRONIC APPARATUS

(71) Applicant: CANON KABUSHIKI KAISHA, Tokyo (JP)

(72) Inventors: Makoto Aoki, Tokyo (JP); Tomohisa Ishigami, Kanagawa (JP); Yu Ogawa, Tokyo (JP)

(73) Assignee: Canon Kabushiki Kaisha, Tokyo (JP)

(\*) Notice: Subject to any disclaimer, the term of this patent is extended or adjusted under 35 U.S.C. 154(b) by 240 days.

(21) Appl. No.: 17/829,398

(22) Filed: Jun. 1, 2022

(65) Prior Publication Data
US 2022/0400547 A1    Dec. 15, 2022

(30) Foreign Application Priority Data

Jun. 10, 2021 (JP) .................................. 2021-097003
Apr. 26, 2022 (JP) .................................. 2022-072225

(51) Int. Cl.
| | |
|---|---|
| H05K 1/02 | (2006.01) |
| H04N 23/52 | (2023.01) |
| H05K 1/18 | (2006.01) |
| H01R 12/79 | (2011.01) |

(52) U.S. Cl.
CPC .......... *H05K 1/0224* (2013.01); *H04N 23/52* (2023.01); *H05K 1/0219* (2013.01); *H05K 1/189* (2013.01); *H01R 12/79* (2013.01); *H05K 2201/042* (2013.01); *H05K 2201/0715* (2013.01); *H05K 2201/09236* (2013.01); *H05K 2201/09254* (2013.01)

(58) Field of Classification Search
CPC .. H05K 1/0218; H05K 1/0225; H05K 1/0227; H05K 1/0248
See application file for complete search history.

(56) References Cited

U.S. PATENT DOCUMENTS

| | | | |
|---|---|---|---|
| 6,835,936 B2 | 12/2004 | Okada et al. | |
| 6,847,041 B2 | 1/2005 | Okada et al. | |
| 6,911,654 B2 | 6/2005 | Okada et al. | |
| 6,992,296 B2 | 1/2006 | Okada et al. | |
| 7,112,802 B2 | 9/2006 | Ogawa | |
| 7,170,063 B2 | 1/2007 | Okada et al. | |
| 7,244,945 B2 | 7/2007 | Okada et al. | |
| 7,425,707 B2 | 9/2008 | Okada et al. | |
| 10,069,190 B2 | 9/2018 | Aoki | |
| 10,250,286 B2 | 4/2019 | Aoki et al. | |
| 10,516,200 B2 | 12/2019 | Aoki | |
| 10,820,457 B1 * | 10/2020 | Kishi | H05K 1/0227 |
| 10,886,648 B2 | 1/2021 | Aoki | |
| 10,978,802 B2 | 4/2021 | Abe et al. | |
| 11,412,616 B2 | 8/2022 | Tsuboi et al. | |

(Continued)

FOREIGN PATENT DOCUMENTS

JP    2007-335455 A    12/2007

OTHER PUBLICATIONS

Copending U.S. Appl. No. 17/810,917, filed Jul. 6, 2022.

*Primary Examiner* — Jeremy C Norris
(74) *Attorney, Agent, or Firm* — Venable LLP

(57) ABSTRACT

A wiring board includes a signal line, a shield member whose main surface extends along the signal line, and a branch line that is electrically connected to the shield member, that includes a leading end that is opened, and that extends in a direction parallel with the main surface of the shield member.

20 Claims, 12 Drawing Sheets

(56) References Cited

U.S. PATENT DOCUMENTS

| | | | |
|---|---|---|---|
| 2013/0322833 A1* | 12/2013 | Hirayama | H05K 1/025 385/92 |
| 2020/0266523 A1* | 8/2020 | Park | H01Q 5/371 |
| 2022/0263236 A1 | 8/2022 | Aoki et al. | |
| 2022/0272833 A1 | 8/2022 | Ishigami et al. | |

* cited by examiner

WIRING BOARD, ELECTRONIC MODULE, AND ELECTRONIC APPARATUS

BACKGROUND OF THE INVENTION

Field of the Invention

The present disclosure relates to a technology for taking countermeasures against noise.

Description of the Related Art

In recent years, images produced by electronic apparatuses, such as digital cameras, are increasingly being improved in quality. Thus, the electronic apparatuses are required to transmit a large amount of digital signals at high speed. However, as the speed of signals increases, the level of electromagnetic noise that leaks from a signal line tends to increase. If the electromagnetic noise increases, the electromagnetic noise may interfere with a circuit or the like of the electronic apparatus, possibly causing a malfunction of the electronic apparatus. For countermeasures against this problem, Japanese Patent Application Publication No. 2007-335455 discloses a flexible printed wiring board that reduces the electromagnetic noise, and the electromagnetic noise is reduced by enclosing signal lines with a ground layer and a shield layer that are electrically connected to each other.

However, if the signal lines are enclosed with the ground layer and the shield layer in the flexible printed wiring board, the rigidity of the flexible printed wiring board may increase. In addition, in a rigid printed wiring board, if signal lines are enclosed with a ground layer and a shield layer, the flexibility in design may decrease. Thus, even for a wiring board that does not have such a structure, it is preferable to reduce the electromagnetic noise.

SUMMARY OF THE INVENTION

According to one aspect of the present invention, a wiring board includes a signal line, a shield member whose main surface extends along the signal line, and a branch line that is electrically connected to the shield member, that includes a leading end that is opened, and that extends in a direction parallel with the main surface of the shield member.

Further features of the present invention will become apparent from the following description of exemplary embodiments with reference to the attached drawings.

DESCRIPTION OF THE EMBODIMENTS

Hereinafter, some embodiments of the present invention will be described in detail with reference to the accompanying drawings.

First Embodiment

Figure 1:
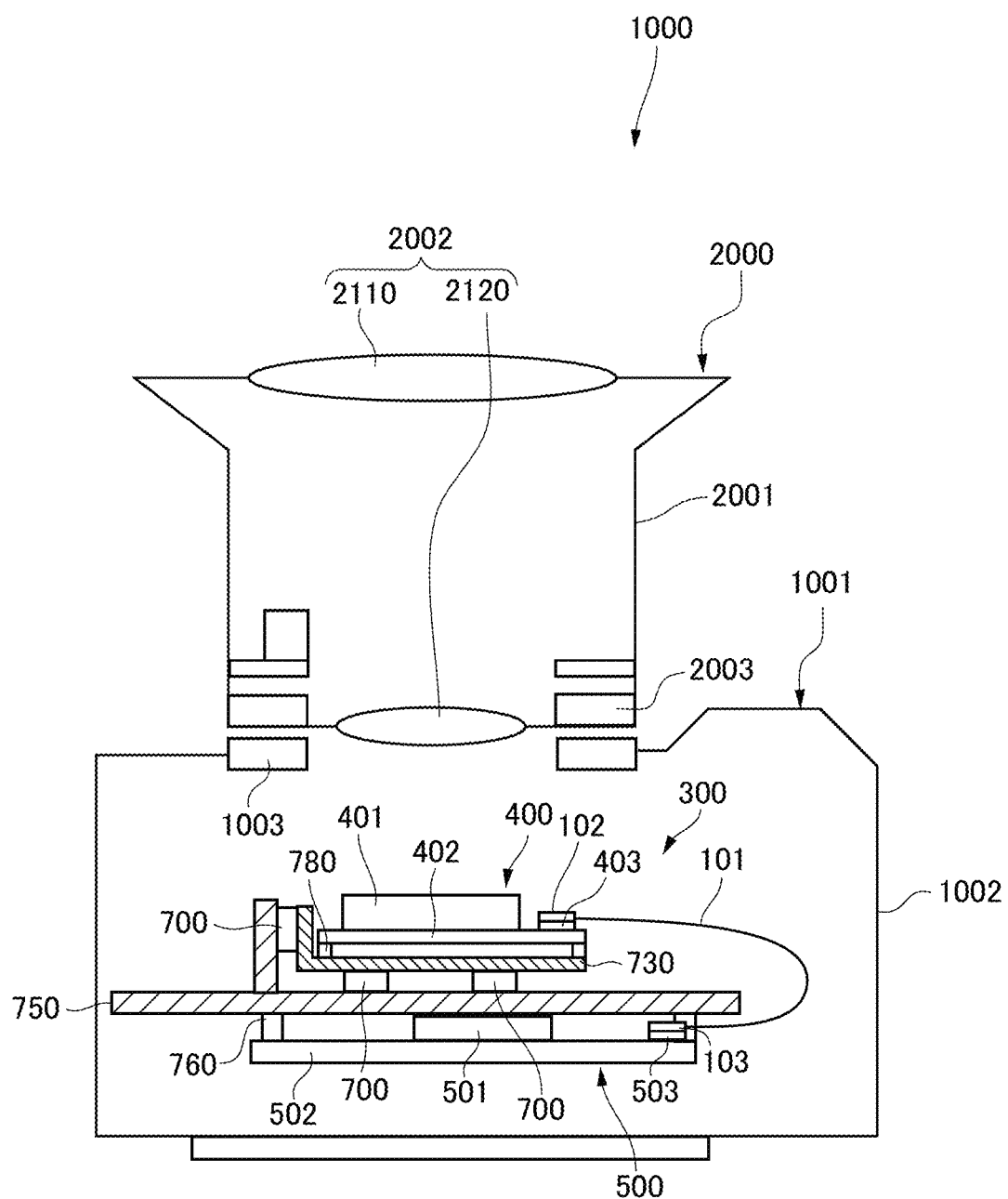
FIG. 1 is a schematic diagram of a camera of a first embodiment.

FIG. 1 is a schematic diagram of a camera 1000 of a first embodiment. The camera 1000 is a digital camera, such as a digital still camera. The camera 1000 may be integrated with a lens. In the present embodiment, the camera 1000 is a digital single-lens camera, and includes a camera body 1001. The camera body 1001, or the camera 1000, is one example of electronic apparatuses. A lens barrel 2000 is detachably attached to the camera body 1001.

The camera body 1001 includes a housing 1002 that includes an exterior case. The housing 1002 includes a mount 1003, to which the lens barrel 2000 is detachably attached.

The lens barrel 2000 is an interchangeable lens. The lens barrel 2000 includes a lens housing 2001 and an image-forming optical system 2002. The image-forming optical system 2002 is supported by the lens housing 2001, and forms an optical image on a later-described image sensor 401 in a state where the lens housing 2001 is attached to the housing 1002. The image-forming optical system 2002 includes a plurality of lenses 2110 and 2120, which are disposed adjacent to each other in the optical-axis direction.

On the lens housing 2001, a ring mount 2003 is disposed. The ring mount 2003 is attached to the mount 1003.

Figure 2A:
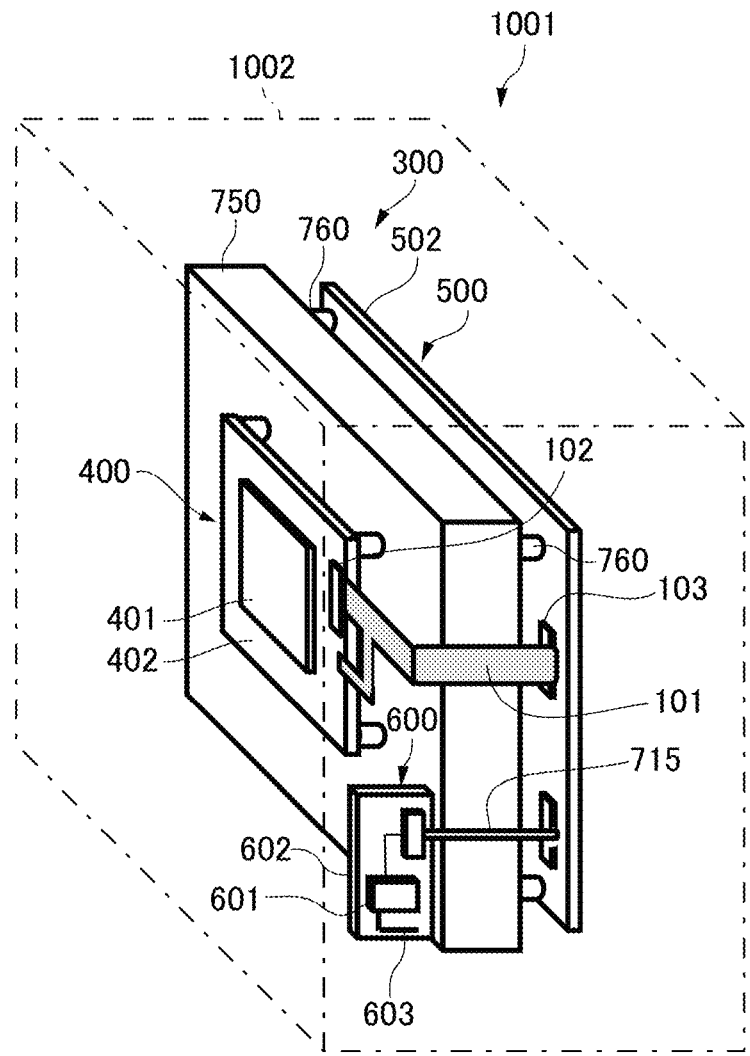
FIG. 2A is a perspective view of members disposed in a housing of a camera body of the first embodiment.
Figure 2B:
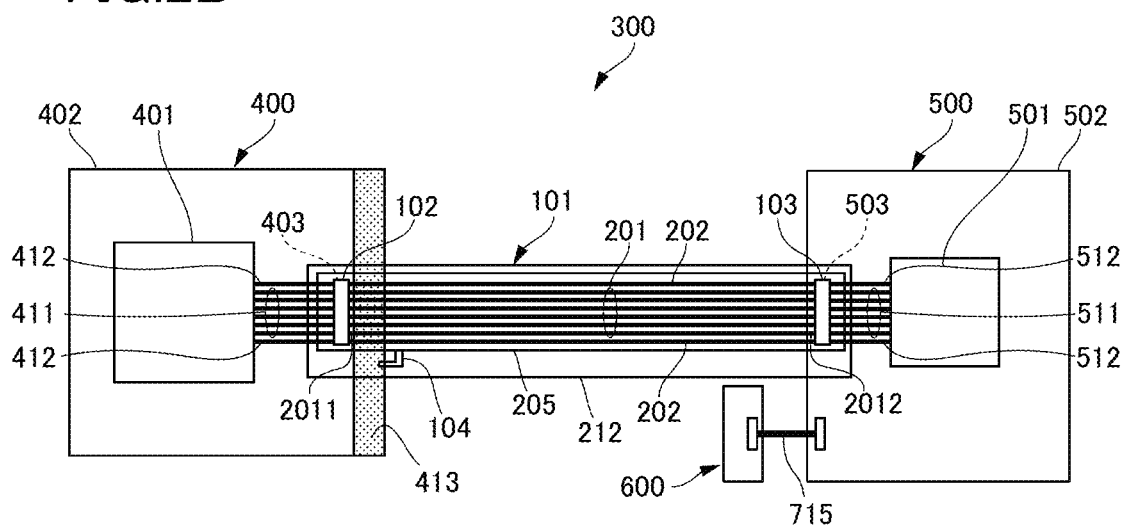
FIG. 2B is a schematic diagram illustrating a configuration of an electronic module of the first embodiment.

The camera body 1001 includes an electronic module 300 disposed in the housing 1002. FIG. 2A is a perspective view of members disposed in the housing 1002 of the camera body 1001 of the first embodiment. FIG. 2B is a schematic diagram illustrating a configuration of the electronic module 300 of the first embodiment. Hereinafter, a configuration of the camera body 1001 will be described in detail with reference to FIGS. 1, 2A, and 2B.

The electronic module 300 includes an image pickup unit 400, an image processing unit 500, and a wireless communication unit 600. The image pickup unit 400 and the image processing unit 500 are connected to each other via a flexible printed wiring board 101, so that the image pickup unit 400 and the image processing unit 500 can perform data communication with each other by using digital signals. In addition, the image processing unit 500 and the wireless communication unit 600 are connected to each other via a cable 715, so that the image processing unit 500 and the wireless communication unit 600 can transmit data to each other by using digital signals.

Data signals used for communication between the image pickup unit 400 and the image processing unit 500 via the flexible printed wiring board 101 are digital signals having a transmission rate of 1 Gbps or more. In the first embodiment, the data signals are digital signals that represent image data. The digital signals transmitted via the flexible printed wiring board 101 may be single-ended signals or differential signals. Preferably, the digital signals are differential signals that enable faster transmission speed than the single-ended signals do. Thus, in the first embodiment, the digital signals transmitted from the image pickup unit 400 to the image processing unit 500 via the flexible printed wiring board 101 are differential signals.

The image pickup unit 400 is a printed circuit board that includes the image sensor 401 and a printed wiring board 402. The image sensor 401 is one example of electronic components, and is mounted on the printed wiring board 402. The printed wiring board 402 is a rigid printed wiring board.

The image sensor 401 may be a complementary metal oxide semiconductor (CMOS) image sensor or a charge coupled device (CCD) image sensor. The image sensor 401 performs photoelectric conversion on an optical image formed by the lens barrel 2000, and outputs electric signals each representing data of a corresponding one of a plurality of pixels.

The image processing unit 500 is one example of electronic units. The image processing unit 500 is a printed circuit board that includes an image processing IC 501 and a printed wiring board 502 on which the image processing IC 501 is mounted. The printed wiring board 502 is a rigid printed wiring board.

For example, the image processing IC 501 is a digital signal processor. The image processing IC 501 has a function that receives an electric signal, which represents data of each pixel, from the image sensor 401 via the flexible printed wiring board 101; corrects the electric signal; and creates image data from the corrected electric signal. In addition, the image processing IC 501 has a function that receives image data from the wireless communication unit 600, and a function that sends image data to the wireless communication unit 600.

The wireless communication unit 600 is a printed circuit board that wirelessly communicates with an external apparatus, such as a PC or a wireless router. The wireless communication unit 600 includes a wireless communication IC 601 and a printed wiring board 602 on which the wireless communication IC 601 is mounted. The printed wiring board 602 is a rigid printed wiring board. The printed wiring board 602 includes an antenna 603 that is a conductor trace or the like.

The wireless communication IC 601 is an IC that transmits/receives data to/from an external apparatus via the antenna 603. For example, the wireless communication IC 601 modulates a digital signal that represents image data, and transmits the modulated signal from the antenna 603, as a radio wave having a communication frequency that conforms to wireless communication standards. In addition, the wireless communication IC 601 demodulates a radio wave received by the antenna 603, to a digital signal that represents image data. The communication frequency is a frequency equal to or larger than 700 MHz and equal to or smaller than 66 GHz. For example, the communication frequency is a frequency in a 2.4 GHz band or a 5 GHz band.

The wireless communication unit 600, or the wireless communication IC 601, communicates wirelessly with an external apparatus in conformity with wireless communication standards. For example, the wireless communication standards are WiFi (registered trademark) standards or Bluetooth (registered trademark) standards. In the present embodiment, the wireless communication standards are WiFi (registered trademark) standards.

On the printed wiring board 402 of the image pickup unit 400, a connector 403 is mounted. The connector 403 is electrically connected to the image sensor 401 via a wiring trace that includes a signal line 411 and a ground line 412 formed on the printed wiring board 402. The printed wiring board 402 also includes a ground trace 413. The ground trace 413 is formed on a surface of the printed wiring board 402 on which the connector 403 is mounted. That is, the ground trace 413 is formed on a surface layer of the printed wiring board 402, which is a conductor layer. The ground trace 413 is electrically connected to the ground line 412. The ground trace 413 may be integrated with the ground line 412.

On the printed wiring board 502 of the image processing unit 500, a connector 503 is mounted. The connector 503 is electrically connected to the image processing IC 501 via a wiring trace that includes a signal line 511 and a ground line 512 formed on the printed wiring board 502.

The flexible printed wiring board 101 has flexibility, and is disposed in the housing 1002 in a state where the flexible printed wiring board 101 is bent. Note that FIG. 2B schematically illustrates a state where the flexible printed wiring board 101 is stretched straight A connector 102 is disposed at one of two ends of the flexible printed wiring board 101 in a wiring direction that is the longitudinal direction of the flexible printed wiring board 101. In addition, a connector 103 is disposed at the other of the two ends of the flexible printed wiring board 101 in the longitudinal direction of the flexible printed wiring board 101. The connector 102 is attached to the connector 403. The connector 103 is attached to the connector 503. Thus, the connector 102 is connected to the connector 403, and the connector 103 is connected to the connector 503. As a result, the image sensor 401 of the image pickup unit 400 and the image processing IC 501 of the image processing unit 500 are communicatively connected to each other via the flexible printed wiring board 101.

In the housing 1002, a metal frame 750 is disposed. The image processing unit 500 is fixed to the metal frame 750 via a metal member 760. That is, the ground of the printed wiring board 502 of the image processing unit 500 is grounded to the metal frame 750.

On the metal frame 750, a plurality of coils 700 is disposed. The coils 700 are one example of a driving apparatus that mechanically drives the image pickup unit 400. The image pickup unit 400 is fixed to a metal member 730 illustrated in FIG. 1, via a metal member 780; and is supported by the metal frame 750 via the metal member 730 and the plurality of coils 700. In addition, the metal member 730 and the metal frame 750 are electrically connected to each other via the plurality of coils 700. That is, the ground of the printed wiring board 402 is grounded to the metal frame 750.

Each of the coils 700 produces the Lorentz force, and drives the image pickup unit 400 with respect to the metal frame 750, toward a direction opposite to a direction in which a camera shake has occurred. Thus, the image pickup unit 400 is driven by the plurality of coils 700, so that the function for correcting the camera shake is achieved. For this reason, it is preferable that the flexible printed wiring board 101 have flexibility.

Figure 3A:
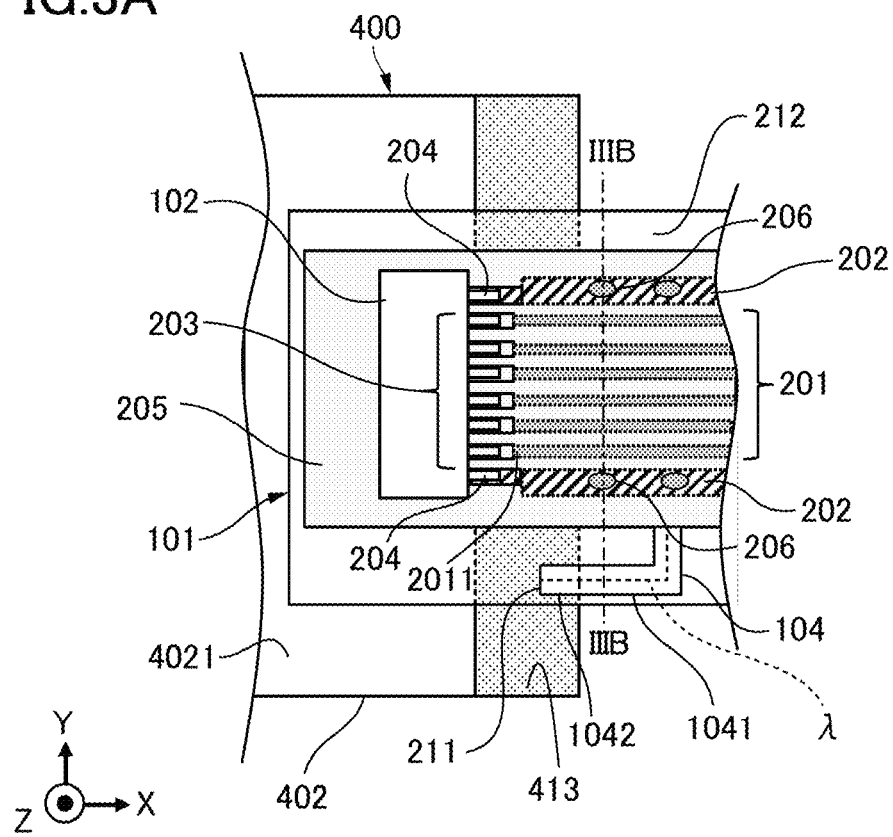
FIG. 3A is a schematic plan view illustrating a structure of connection of the first embodiment, between a printed wiring board of an image pickup unit and a flexible printed wiring board.
Figure 3B:
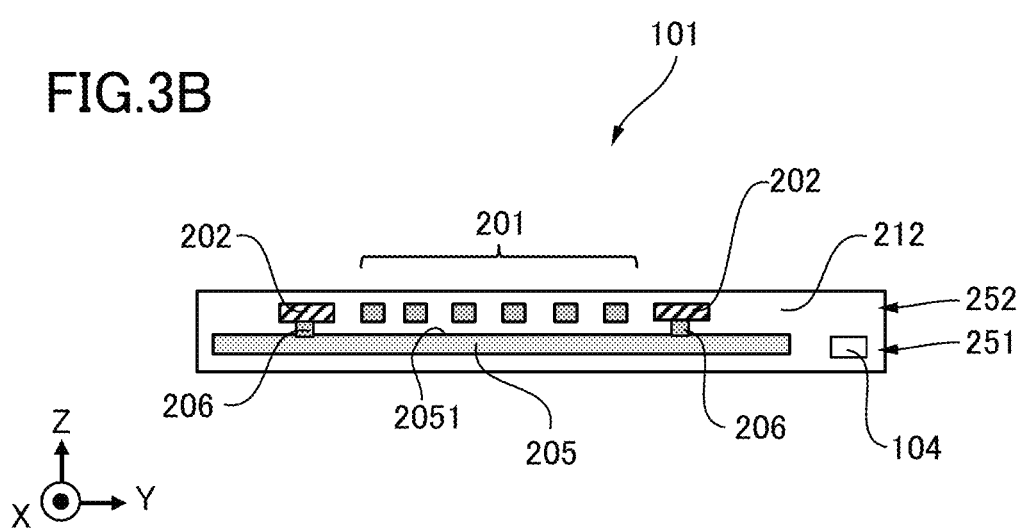
FIG. 3B is a cross-sectional view of the flexible printed wiring board, taken along a line IIIB-IIIB illustrated in FIG. 3A.
Figure 4:
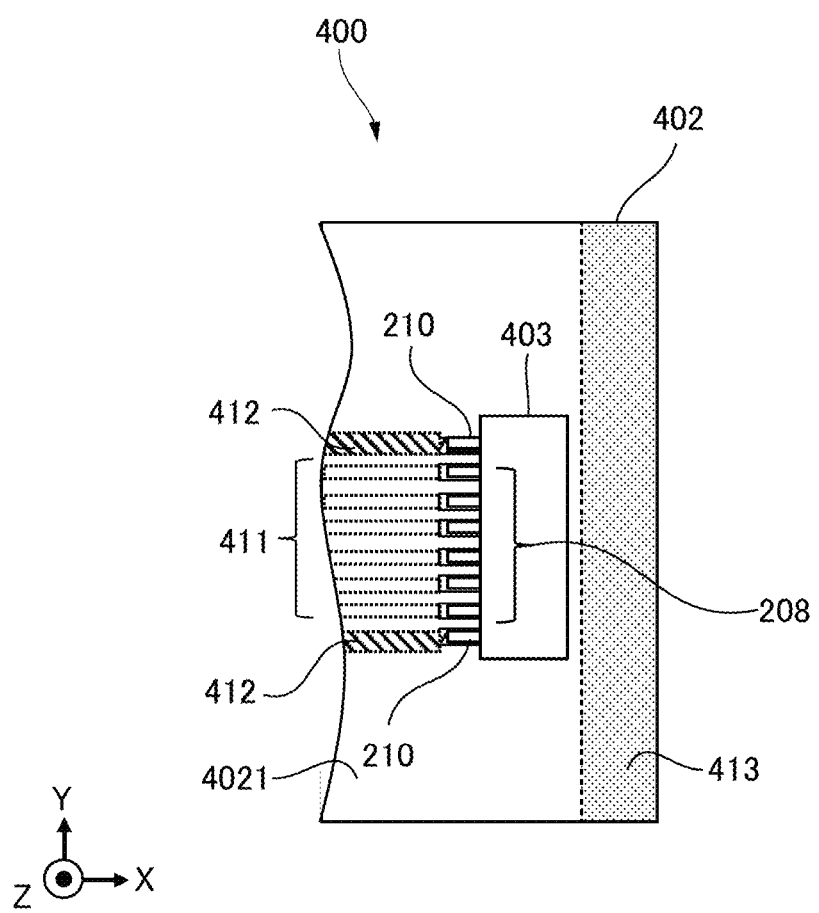
FIG. 4 is a schematic plan view illustrating the image pickup unit of the first embodiment.

FIG. 3A is a schematic plan view illustrating a structure of connection of the first embodiment, between the printed wiring board 402 of the image pickup unit 400 and the flexible printed wiring board 101. FIG. 3B is a cross-sectional view of the flexible printed wiring board 101, taken along a line IIIB-IIIB illustrated in FIG. 3A. FIG. 4 is a schematic plan view illustrating the image pickup unit 400 of the first embodiment.

The flexible printed wiring board 101 includes at least two conductor layers. In the first embodiment, the flexible printed wiring board 101 includes a conductor layer 251 and a conductor layer 252. The conductor layer 252 is disposed, spaced from the conductor layer 251 in a Z direction. The flexible printed wiring board 101 includes an insulating member 212 and a shield member 205 held by the insulating member 212. The shield member 205 is a conductor that is disposed in the conductor layer 251, and that constitutes a conductor trace. The conductor trace constituted by the shield member 205 extends in an X direction that is the longitudinal direction of the flexible printed wiring board 101, and in a Y direction that is the lateral direction of the flexible printed wiring board 101. The X direction and the Y direction are perpendicular to the Z direction, and extend in parallel with a main surface 2051 of the shield member 205. The Z direction is a direction perpendicular to the main surface 2051 of the shield member 205. The shield member 205 is disposed for shielding against the electromagnetic noise, and is a solid or mesh conductor trace.

The flexible printed wiring board 101 includes a signal line 201 and a ground line 202, which are held by the insulating member 212. Each of the signal line 201 and the ground line 202 is a conductor. Specifically, each of the signal line 201 and the ground line 202 is a strip-shaped conductor trace that has a predetermined width and a predetermined thickness, and that extends in the X direction that is the longitudinal direction. Preferably, the width of the ground line 202 is larger than the width of the signal line 201.

The signal line 201 may be plural in number. In this case, the signal lines 201 are all disposed in the conductor layer 252, spaced from each other in the Y direction that is the width direction of the flexible printed wiring board 101. The ground line 202 is disposed in the conductor layer 252, in which the signal line 201 is disposed. In addition, the ground line 202 is disposed adjacent to the signal line 201 in the Y direction. When viewed in the Z direction perpendicular to the main surface 2051 of the shield member 205, the signal line 201 and the ground line 202 overlap with the shield member 205. That is, the signal line 201 and the ground line 202 are disposed along the main surface 2051 of the shield member 205. In other words, the shield member 205 faces the signal line 201 and the ground line 202 via the insulating member 212, with the main surface 2051 being formed along the signal line 201 and the ground line 202. Thus, the signal line 201 and the ground line 202 are disposed so as to face the main surface 2051 of the shield member 205 via the insulating member 212.

The ground line 202 disposed in the conductor layer 252 and the shield member 205 disposed in the conductor layer 251 are electrically connected to each other via a via 206.

The connector 102 mounted on the flexible printed wiring board 101 includes a pin 203 connected to the signal line 201, and a pin 204 connected to the ground line 202. The connector 403 mounted on the printed wiring board 402 includes a pin 208 connected to the signal line 411, and a pin 210 connected to the ground line 412.

Figure 5A:
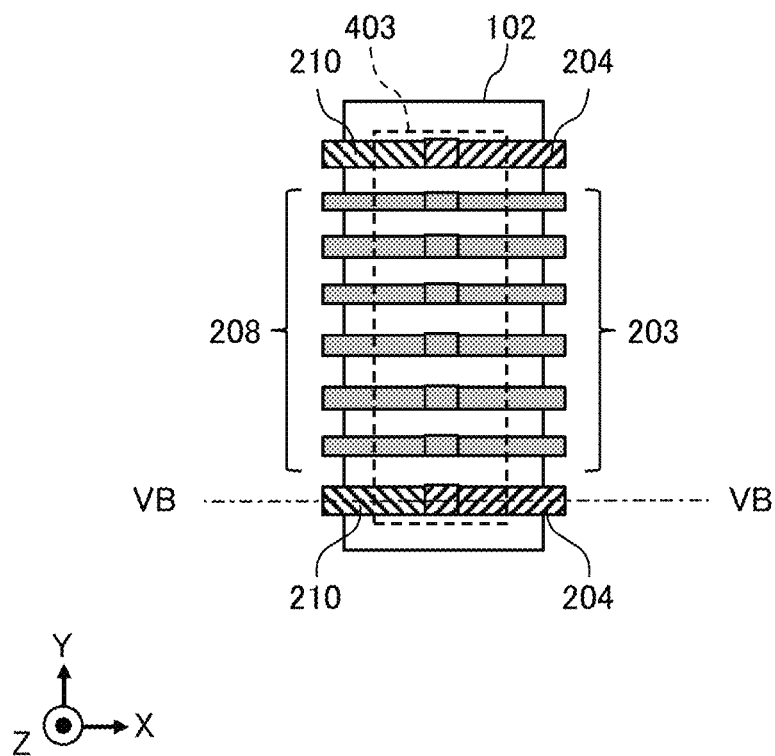
FIG. 5A is a schematic plan view of a structure of connection of two connectors of the first embodiment.
Figure 5B:
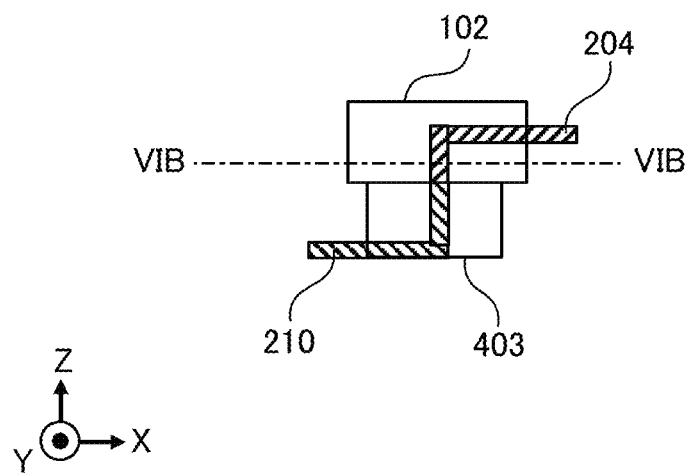
FIG. 5B is a schematic cross-sectional view of the structure of connection of the two connectors, taken along a line VB-VB in FIG. 5A.

FIG. 5A is a schematic plan view of a structure of connection of the two connectors 102 and 403 of the first embodiment. In FIG. 5A, the two connectors 102 and 403 are connected to each other. FIG. 5B is a schematic cross-sectional view of the structure of connection of the two connectors 102 and 403, taken along a line VB-VB of FIG. 5A. When the connector 102 is connected to the connector 403, the pin 203 contacts the pin 208 and the signal line 201 is electrically connected to the signal line 411, and the pin 204 contacts the pin 210 and the ground line 202 is electrically connected to the ground line 412.

By the way, if a common mode noise is superimposed on a signal in the image sensor 401, common mode currents occur in a signal line and a ground line in the flexible printed wiring board 101, and the common mode current in the signal line and the common mode current in the ground line propagate in the same direction. In addition, if the common mode currents propagate in the signal line and the ground line, the electromagnetic noise is radiated from the flexible printed wiring board 101 due to the common mode currents. The electromagnetic noise is referred to also as radiation noise.

For reducing the common mode current that propagates from the connector 102 to the connector 103, the flexible printed wiring board 101 of the first embodiment includes a branch line 104 that is electrically connected to the shield member 205. The leading end of the branch line 104 is an open end 211 that is opened. The branch line 104 is a conductor trace formed not across a plurality of conductor layers but in a single conductor layer. In the first embodiment, the branch line 104 is a conductor trace formed in the conductor layer 251. That is, the branch line 104 is a conductor trace formed so as to extend in the X direction and/or the Y direction, which are parallel with the main surface 2051 of the shield member 205. In the first embodiment, the branch line 104 is a conductor trace that extends like a strip. Since the level of the conduction noise, which is a common mode current that propagates in the flexible printed wiring board 101, is reduced, the level of the electromagnetic noise radiated from the flexible printed wiring board 101 is reduced.

Figure 6A:
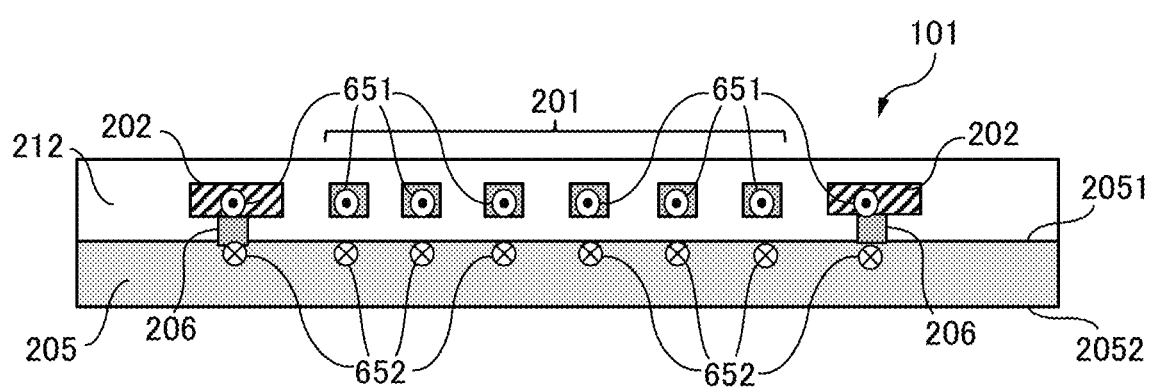
FIG. 6A is a schematic diagram illustrating a distribution of current that flows in the flexible printed wiring board of the first embodiment.
Figure 6B:
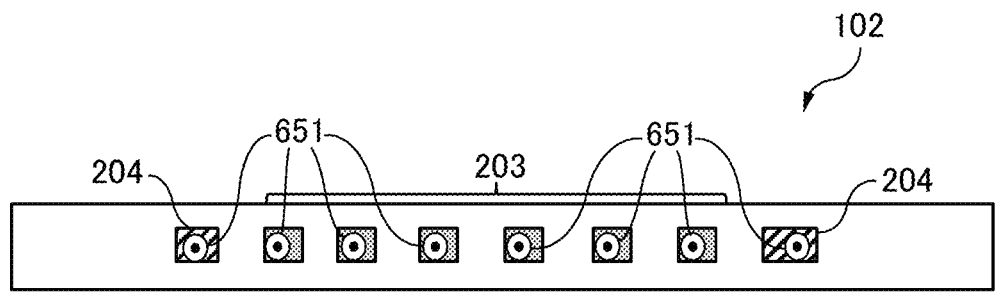
FIG. 6B is a schematic diagram illustrating a distribution of current that flows in a connector of the first embodiment.

Hereinafter, the mechanism that reduces the electromagnetic noise radiated from the flexible printed wiring board 101 will be described. FIG. 6A is a schematic diagram illustrating a distribution of current that flows in the flexible printed wiringboard 101 of the first embodiment. FIG. 6B is a schematic diagram illustrating a distribution of current that flows in the connector 102 of the first embodiment. FIG. 6A illustrates the distribution of current, obtained in a cross section of the flexible printed wiring board 101 taken along the line IIIB-IIIB of FIG. 3A. FIG. 6B illustrates the distribution of current, obtained in a cross section of the connector 102 taken along a line VIB-VIB of FIG. 5B.

As illustrated in FIG. 6A, in the flexible printed wiring board 101, common mode currents 651 flow in the signal line 201 and the ground line 202 in the same direction. If the shield member 205 is disposed, return paths are formed in the shield member 205 for the common mode currents 651, and return currents 652 flow in the shield member 205. As a result, the electromagnetic noise is reduced. On the other hand, as illustrated in FIG. 6B, although the common mode currents 651 flow through the pin 203 and the pin 204, no return paths are formed in the connector 102.

Figure 7A:
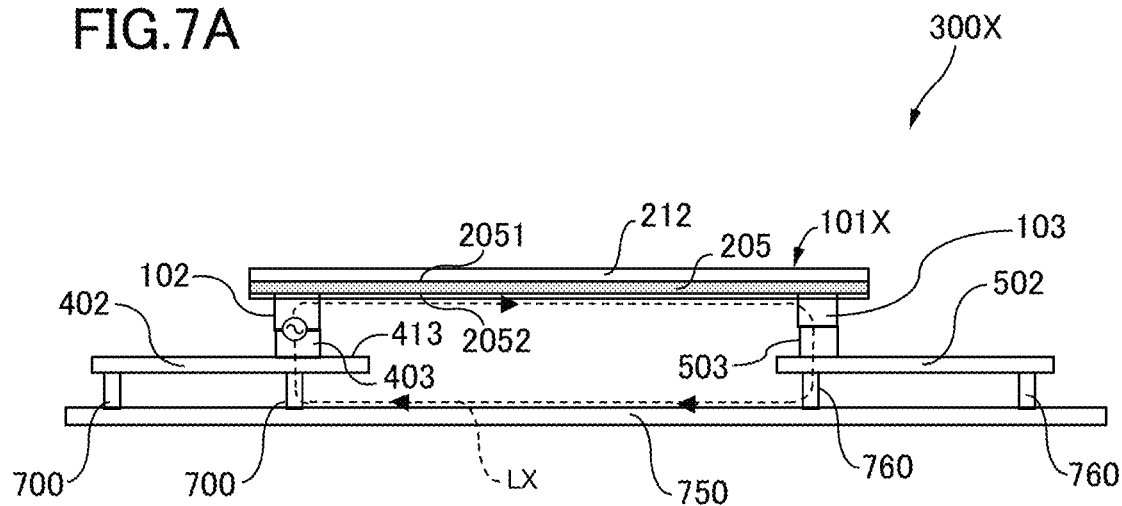
FIG. 7A is a diagram illustrating an electronic module of a comparative example.
Figure 7B:
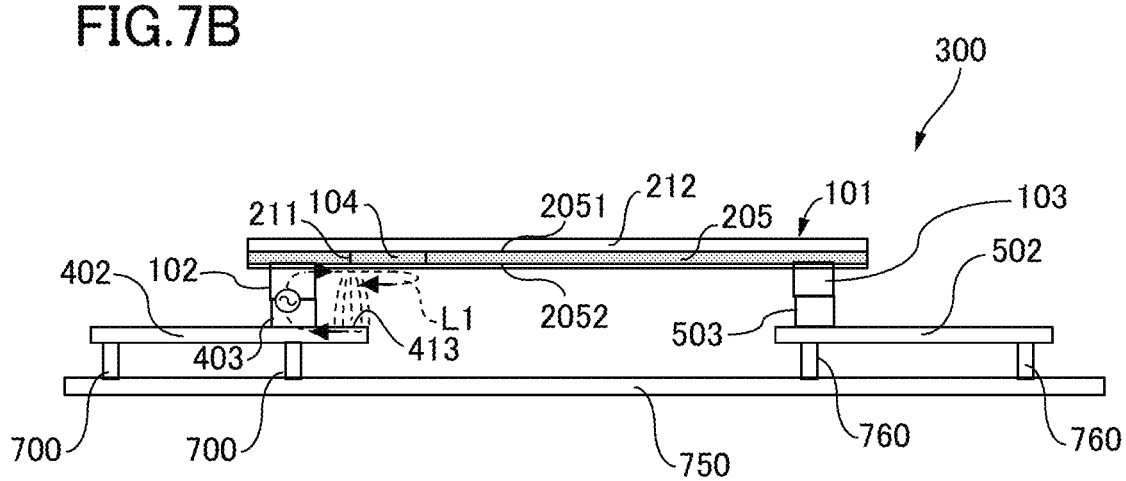
FIG. 7B is a diagram illustrating an electronic module of the first embodiment.

Next, the difference between a path of a common mode current formed when the branch line 104 is disposed and a path of a common mode current formed when the branch line 104 is not disposed will be described. FIG. 7A is a diagram illustrating an electronic module 300X of a comparative example. FIG. 7B is a diagram illustrating the electronic module 300 of the first embodiment A flexible printed wiring board 101X of the electronic module 300X of the comparative example has the same configuration as that of the flexible printed wiring board 101 of the first embodiment, except that the flexible printed wiring board 101X does not include the branch line 104.

The printed wiring board 402 is a board that transmits a signal, and the printed wiring board 502 is a board that receives a signal. The ground and the shield member 205 of each of the flexible printed wiring boards 101 and 101X are electrically connected to the metal frame 750; and the ground of the printed wiring board 402 and the ground of the printed wiring board 502 are electrically connected to the metal frame 750. As illustrated in FIG. 7A, in the electronic module 300X of the comparative example, since no return paths are formed at the connector 102, potential fluctuation occurs between the shield member 205 and the ground trace 413 of the printed wiring board 402. The potential fluctuation causes the formation of a loop path LX in which a part of the common mode current propagates to the metal frame 750 along a surface 2052 of the shield member 205. The surface 2052 of the shield member 205 is opposite to the main surface 2051 of the shield member 205. Hereinafter, the common mode current produced in the shield member 205 is referred to also as noise current.

However, the flexible printed wiring board 101 of the first embodiment includes the branch line 104. The spatial impedance has a high value at the open end 211 of the branch line 104, and has a low value at a connecting portion between the branch line 104 and the shield member 205. Thus, as illustrated in FIG. 7B, a part of the common mode current, which occurs in the connector 102 and flows in the shield member 205, flows into the branch line 104. In addition, since the electric field increases at the open end 211, the common mode current that has flowed to the branch line 104 flows from the branch line 104 to the ground trace 413 due to the capacitive coupling between the branch line 104 and the ground trace 413 of the printed wiring board 402. The common mode current that has flowed to the ground trace 413 returns to the connector 102. Thus, in the first embodiment, the common mode current flows along a loop path L1 shorter than the loop path LX of the comparative example. The loop path L1 does not include the metal frame 750; and includes one portion of the shield member 205, which is shorter than the whole of the shield member 205 in the longitudinal direction of the shield member 205, the branch line 104, and the ground trace 413. As a result, the noise current that propagates in the shield member 205 of the flexible printed wiring board 101, that is, the noise current that reaches the connector 103 is reduced. Consequently, the level of the electromagnetic noise radiated from the flexible printed wiring board 101 is reduced. Furthermore, since the noise current that flows in the metal frame 750 and is scattered in the metal frame 750 is reduced, the level of the electromagnetic noise radiated from the flexible printed wiring board 101 and the metal frame 750 is reduced. Since the level of the electromagnetic noise radiated from the flexible printed wiring board 101 and the metal frame 750 is reduced, the level of the electromagnetic noise received by the wireless communication unit 600 is reduced. As a result, the wireless communication unit 600 can perform stable wireless communication. For example, the electromagnetic noise can be prevented in the wireless communication unit 600, from stopping the wireless communication or extremely reducing the wireless communication speed.

As illustrated in FIG. 3B, the branch line 104 is enclosed by the insulating member 212, and thereby fixed to the insulating member 212. In this manner, the branch line 104 is held by the insulating member 212.

In addition, the ground line 202 is disposed adjacent to the signal line 201 in the Y direction. That is, the ground line 202 is disposed in the conductor layer 252, in which the signal line 201 is disposed. Thus, the flexible printed wiring board 101 has higher flexibility than that of a printed wiring board in which a conductor layer is formed in addition to the conductor layers 251 and 252 and the whole of the additional conductor layer serves as a ground layer. Therefore, even in such a configuration, the level of the electromagnetic noise can be effectively reduced by the branch line 104.

In the first embodiment, the branch line 104 branches from the shield member 205. That is, the branch line 104 is a conductor trace, or a projecting portion, that is formed so as to project from one side of the shield member 205 that extends in the longitudinal direction (X direction) of the shield member 205. Thus, the noise current that propagates in the shield member 205 can be more effectively returned to the connector 102, which is a source of generation of the noise current. Consequently, the electromagnetic noise radiated from the flexible printed wiring board 101 can be more effectively reduced.

As illustrated in FIG. 2B, the signal line 201 has two ends 2011 and 2012 in the X direction that is a direction in which the signal line 201 is disposed. The end 2011 is a first end via which a signal is transmitted. The end 2012 is a second end via which a signal is received. In the first embodiment, the end 2011 is connected to the image pickup unit 400 via the connector 102, and the end 2012 is connected to the image processing unit 500 via the connector 103. Preferably, the branch line 104 is disposed closer to the end 2011 than to the end 2012. In this arrangement, the length of a path along which the noise current propagates can be shortened in the flexible printed wiring board 101. As a result, the electromagnetic noise radiated from the flexible printed wiring board 101 can be more effectively reduced.

In addition, as illustrated in FIG. 3A, the branch line 104 is disposed such that the open end 211, which is the leading end of the branch line 104, faces a side on which the end 2011 of the two ends 2011 and 2012 is positioned. That is, the branch line 104 is disposed, facing the side on which the connector 102 is positioned. In this arrangement, the noise current easily returns to the source of generation of the noise current through the branch line 104. As a result, the electromagnetic noise radiated from the flexible printed wiring board 101 can be more effectively reduced.

In addition, in the first embodiment, the branch line 104 is L-shaped. Thus, one portion 1041 of the branch line 104 that includes the open end 211 extends in the X direction, which extends along the signal line 201. In the first embodiment, the one portion 1041 of the branch line 104 is a portion that extends straight in parallel with the signal line 201. Thus, the width of the flexible printed wiring board 101 in the Y direction can be kept narrow. Note that the shape of the branch line 104 is not limited to an L shape. For example, the branch line 104 may have a shape that includes a curved portion.

In addition, when viewed in a direction orthogonal to the main surface 4021 of the printed wiring board 402 or in the Z direction of FIG. 3A, it is preferable that at least one portion of the branch line 104 overlap with the printed wiring board 402. That is, in the Z direction of FIG. 3A, it is preferable that at least one portion of the branch line 104 face the main surface 4021 of the printed wiring board 402. Note that the Z direction illustrated in FIG. 3A is a direction perpendicular to the main surface 4021 of the printed wiring board 402.

The at least one portion of the branch line 104 may be the whole of the branch line 104. In the first embodiment, the at least one portion of the branch line 104 is one part 1042 of the branch line 104. In particular, when viewed in the Z direction of FIG. 3A, it is preferable that the one part 1042 of the branch line 104 overlap with the ground trace 413 of the printed wiring board 402. In this arrangement, the branch line 104 easily couples capacitively with the ground trace 413 of the printed wiring board 402, so that the electromagnetic noise can be more effectively reduced.

Preferably, the one part 1042 of the branch line 104 includes the open end 211 that is the leading end of the branch line 104. In this arrangement, the branch line 104 more easily couples capacitively with the ground trace 413 of the printed wiring board 402, so that the electromagnetic noise can be more effectively reduced.

Preferably, the length of the one part 1042 of the branch line 104 is equal to or larger than half a length L of the branch line 104. The length L of the branch line 104 is a length measured in a direction in which the branch line 104 extends. Specifically, the length L of the branch line 104 is a length of a line segment of the branch line 104 that passes through a center portion of the branch line 104 located in the width direction of the branch line 104. The electric field level of the branch line 104 becomes maximum at the open end 211, gradually decreases as the measurement point is moved from the open end 211 toward the connecting portion between the branch line 104 and the shield member 205, and becomes zero at the connecting portion. Thus, setting the length of the one part 1042 equal to or larger than half the length L of the branch line 104 is equivalent to making the whole of the branch line 104 face the ground trace 413. In this arrangement, the branch line 104 and the ground trace 413 effectively couple capacitively with each other, so that the noise current can effectively return from the branch line 104 to the connector 102. As a result, the electromagnetic noise can be effectively reduced. For this reason, when viewed in the Z direction perpendicular to the main surface 4021 of the printed wiring board 402, it is preferable that the whole of the branch line 104 overlap with the ground trace 413. Preferably, the branch line 104 is disposed such that when viewed in the Z direction, the open end 211 overlaps with the main surface 4021 of the printed wiring board 402. However, the open end 211 may not overlap with the main surface 4021 of the printed wiring board 402.

The length L of the branch line 104, that is, the length L from the open end 211 to the connecting portion between the branch line 104 and the shield member 205 is determined by the following equation (1). In the equation (1), f is a frequency, c is a light speed, and $\varepsilon_r$ is an effective relative dielectric constant. In the equation (1), the frequency f is a frequency that the wireless communication unit 600 uses for wireless communication, and that is in a range equal to or larger than 700 MHz and equal to or smaller than 66 GHz. The light speed c is about 300,000 km/s. The effective relative dielectric constant $\varepsilon_r$ is determined by the dielectric constant of the insulating member 212 and the distance between the shield member 205 and the metal frame 750.

$$L = \frac{c}{4f\sqrt{\varepsilon_r}} \quad (1)$$

By using the above-described equation (1), it is possible to determine the length L of the branch line 104 that corresponds to a target frequency f of the electromagnetic noise to be reduced. In this manner, the level of the electromagnetic noise can be more reduced at the frequency f. Note that the length L of the branch line 104 that corresponds to the frequency f may deviate from the value determined by using the equation (1), as long as the length L is within ±10% of the value.

Preferably, the frequency f is in a 2.4 GHz band or a 5 GHz band. The 2.4 GHz band is a frequency band equal to or larger than 2.4 GHz and smaller than 2.5 GHz, and the 5 GHz band is a frequency band equal to or larger than 5 GHz and smaller than 6 GHz. Both of the 2.4 GHz band and the 5 GHz band are frequency bands used in WiFi (registered trademark).

Modifications

Figure 8A:
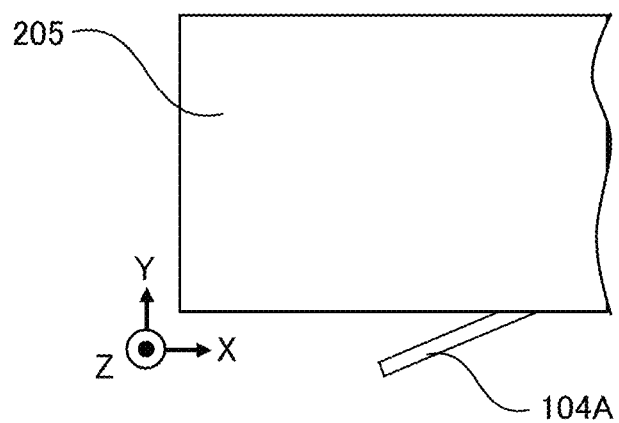
FIG. 8A is a schematic diagram of one portion of a flexible printed wiring board of Modification 1.

FIG. 8A is a schematic diagram of one portion of a flexible printed wiring board of Modification 1. As illustrated in FIG. 8A, a branch line 104A may be shaped like a straight line. In this case, the branch line 104A may be connected to one side of the shield member 205 such that the branch line 104 is inclined with respect to the one side of the shield member 205.

Figure 8B:
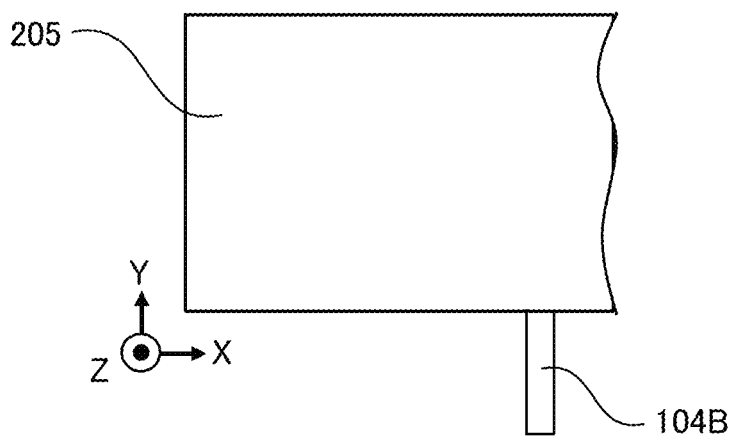
FIG. 8B is a schematic diagram of one portion of a flexible printed wiring board of Modification 2.

FIG. 8B is a schematic diagram of one portion of a flexible printed wiring board of Modification 2. As illustrated in FIG. 8B, a branch line 104B may be shaped like a straight line. In this case, the branch line 104B may be connected to one side of the shield member 205 such that the branch line 104 forms a right angle with the one side of the shield member 205.

Figure 8C:
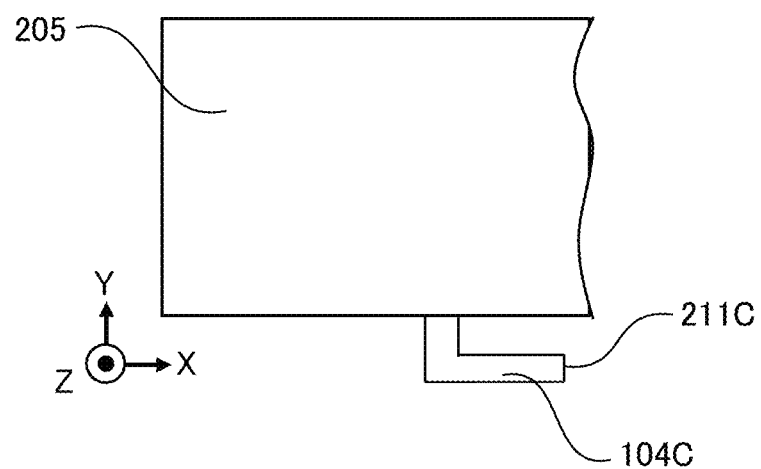
FIG. 8C is a schematic diagram of one portion of a flexible printed wiring board of Modification 3.

FIG. 8C is a schematic diagram of one portion of a flexible printed wiring board of Modification 3. As illustrated in FIG. 8C, an open end 211C of a branch line 104C may face a direction opposite to a direction that the branch line 104 of FIG. 3A faces. Note that although each of the branch lines 104 and 104C includes a single bent portion formed by bending the branch line by 90 degrees, the present disclosure is not limited to this. For example, each of the branch lines 104 and 104C may include two bent portions formed by bending the branch line by 45 degrees. In addition, a bent portion may have an R that is an arch-like round portion.

Figure 9A:
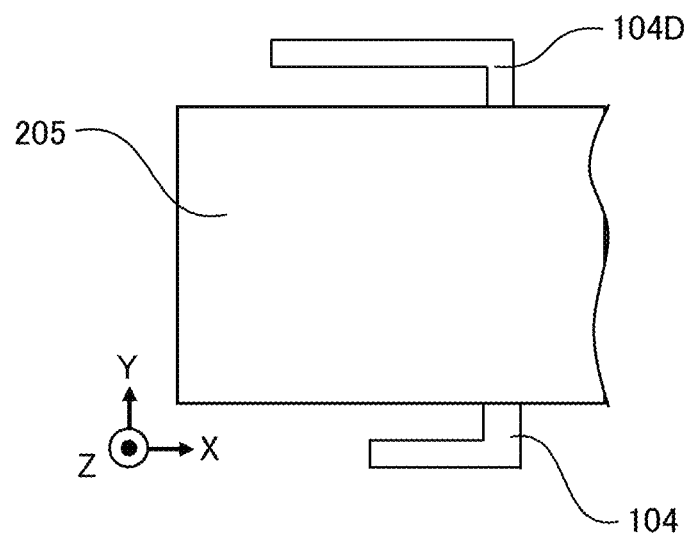
FIG. 9A is a schematic diagram of one portion of a flexible printed wiring board of Modification 4.

FIG. 9A is a schematic diagram of one portion of a flexible printed wiring board of Modification 4. As illustrated in FIG. 9A, the flexible printed wiring board of Modification 4 may include a plurality of branch lines 104 and 104D whose lengths are different from each other. Thus, in Modification 4, the target frequency f of the electromagnetic noise to be reduced can be plural in number. For example, a target frequency corresponding to the long branch line 104D may be a frequency in the 2.4 GHz band, and a target frequency corresponding to the short branch line 104 may be a frequency in the 5 GHz band.

Figure 9B:
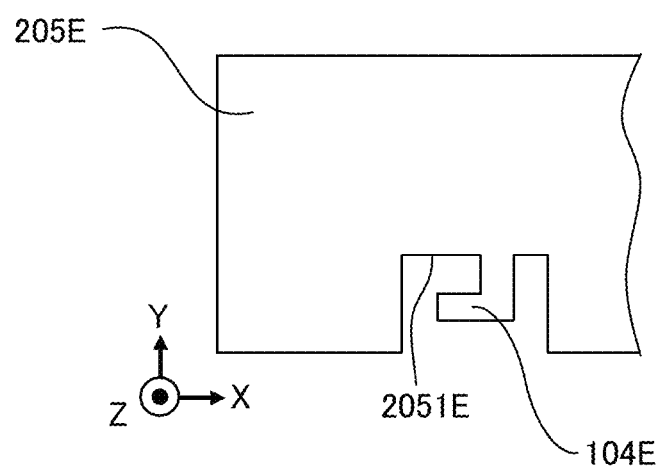
FIG. 9B is a schematic diagram of one portion of a flexible printed wiring board of Modification 5.

FIG. 9B is a schematic diagram of one portion of a flexible printed wiring board of Modification 5. As illustrated in FIG. 9B, one side of a shield member 205E may not be linear, and may include a concave portion 2051E and a branch line 104E formed in the concave portion 2051E.

Second Embodiment

Figure 10A:
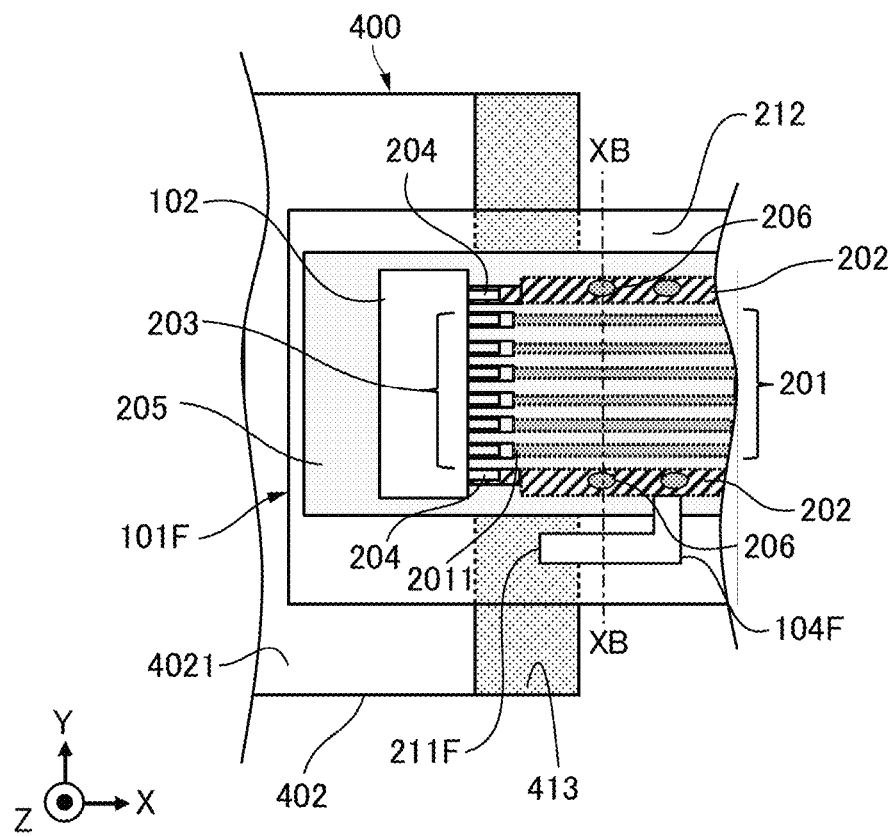
FIG. 10A is a schematic plan view illustrating a structure of connection of a second embodiment, between a printed wiring board of an image pickup unit and a flexible printed wiring board.
Figure 10B:
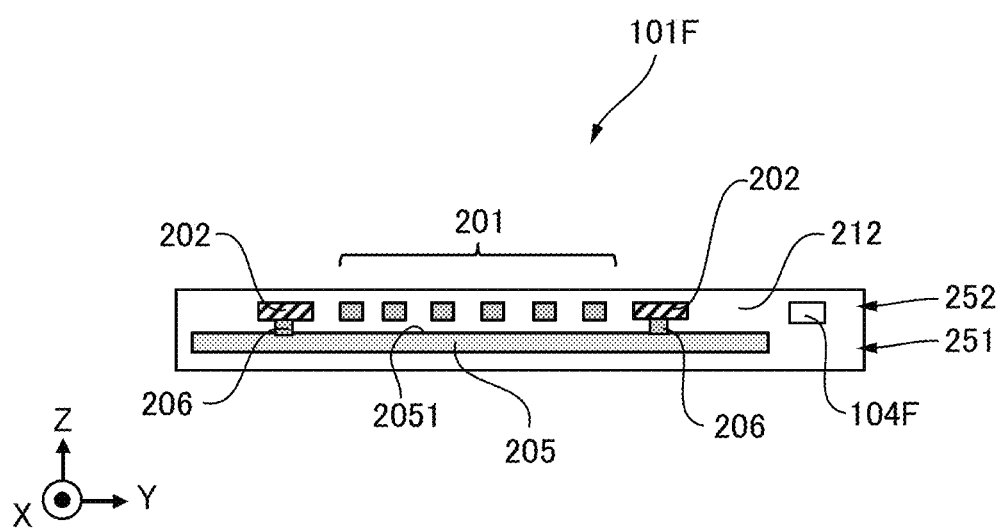
FIG. 10B is a cross-sectional view of the flexible printed wiring board, taken along a line XB-XB illustrated in FIG. 10A.

FIG. 10A is a schematic plan view illustrating a structure of connection of a second embodiment, between the printed wiring board 402 of the image pickup unit 400 and a flexible printed wiring board 101F. FIG. 10B is a cross-sectional view of the flexible printed wiring board 101F, taken along a line XB-XB illustrated in FIG. 10A.

As in the first embodiment, the flexible printed wiring board 101F includes the conductor layer 251 and the conductor layer 252. In addition, as in the first embodiment, the flexible printed wiring board 101F includes the insulating member 212, the shield member 205 held by the insulating member 212, the signal line 201, and the ground line 202. The signal line 201 may be plural in number, and in this case, the signal lines 201 are all disposed in the conductor layer 252. The ground line 202 is disposed in the conductor layer 252, in which the signal line 201 is disposed. In addition, the ground line 202 is disposed adjacent to the signal line 201 in the Y direction. The ground line 202 disposed in the conductor layer 252 and the shield member 205 disposed in the conductor layer 251 are electrically connected to each other via the via 206.

For reducing the common mode current that propagates in the flexible printed wiring board 101F, the flexible printed wiring board 101F includes a branch line 104F that is electrically connected to the shield member 205. The leading end of the branch line 104F is an open end 211F that is opened. The branch line 104F is formed not across a plurality of conductor layers but in a single conductor layer. In the second embodiment, the branch line 104F is formed in the conductor layer 252. That is, the branch line 104F is formed so as to extend in the X direction and/or the Y direction, which are parallel with the main surface 2051 of the shield member 205.

In the second embodiment, the branch line 104F branches from the ground line 202, and is electrically connected to the shield member 205 via the ground line 202 and the via 206. That is, the branch line 104F is a conductor trace, or a projecting portion, that is formed so as to project from one side of the ground line 202 that extends in the longitudinal direction of the ground line 202. Thus, the noise current that propagates in the shield member 205 can be more effectively returned to the connector 102, which is a source of generation of the noise current, by the branch line 104F. As a result, the electromagnetic noise radiated from the flexible printed wiring board 101F can be more effectively reduced.

Note that the flexible printed wiring board 101F of the second embodiment can also be modified like the modifications of the first embodiment.

EXAMPLES

Next, results of experiments performed on flexible printed wiring boards of Examples 1 to 5 and on a flexible printed wiring board of Comparative Example 1 will be described. Since the flexible printed wiring boards of Examples 1 to 5 correspond to the flexible printed wiring board 101 of the first embodiment, an identical component is given an identical symbol, and the description thereof will be made by using the identical symbol. The same holds true for the flexible printed wiring board of Comparative Example 1.

Figure 11A:
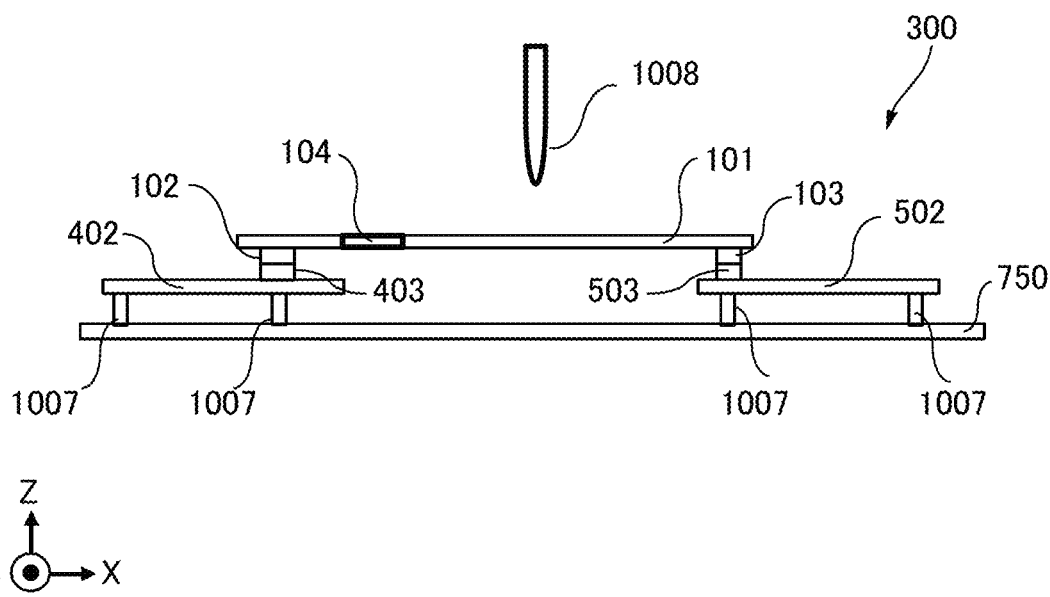
FIG. 11A is a side view illustrating one portion of an electronic module of an example.
Figure 11B:
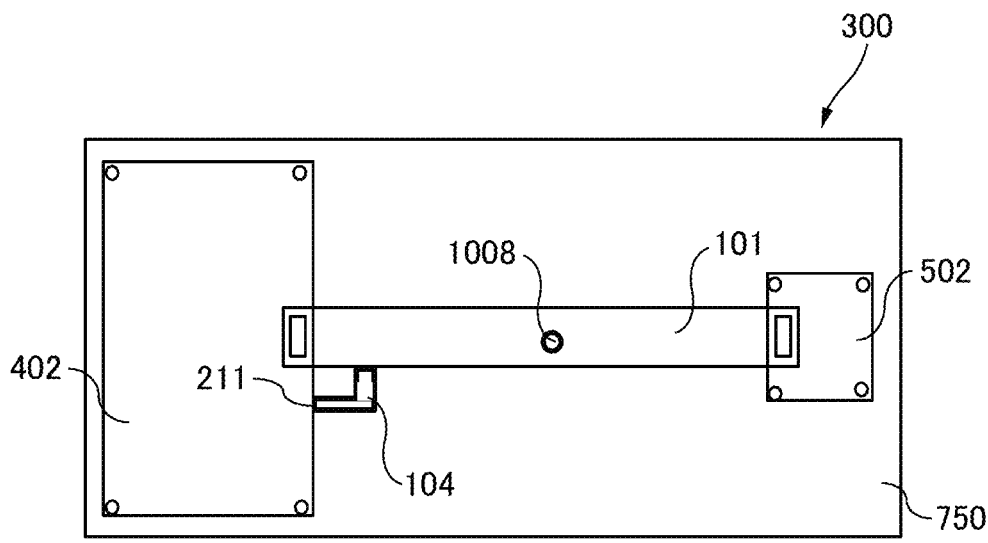
FIG. 11B is a plan view illustrating one portion of the electronic module of the example.

FIG. 11A is a side view illustrating one portion of the electronic module 300 of the examples. FIG. 11B is a plan view illustrating one portion of the electronic module 300 of the examples. As illustrated in FIGS. 11A and 11B, the flexible printed wiring board 101 was stretched straight, and the printed wiring board 402 and the printed wiring board 502 were both fixed to a surface of the metal frame 750 via metal members 1007.

The outer dimensions of the printed wiring board 402 were set at 129.0×210.0 mm, and the thickness of the printed wiring board 402 was set at 1.6 mm. The printed wiring board 402 used was a six-layer board. In addition, twenty ICs, THCV215, made by Thine Electronics, Inc. were mounted on the printed wiring board 402. The ICs output differential signals. The frequency of the differential signals was set at 3.53 GHz. In addition, twenty pairs of two signal lines were formed, as differential signal lines, on the printed wiring board 402. When the ICs output differential signals, electromagnetic noise caused by the common mode current was detected in a wide range from 1 GHz to 6 GHz.

The outer dimensions of the flexible printed wiring board 101 were set at 144.0×27.0 mm, and the thickness of the flexible printed wiring board 101 was set at 37.5 μm. The flexible printed wiring board 101 used was a single-layer board. In addition, the shield member 205 made of silver was formed on the whole of one side of the flexible printed wiring board 101 through shield printing.

The connector 102 used for connecting the flexible printed wiring board 101 and the printed wiring board 402 was a DF40C-70DS-0.4V (51) made by HIROSE ELECTRIC CO., LTD. The connector 403 used for connecting the printed wiring board 402 and the flexible printed wiring board 101 was a DF40C-70DP-0.4V (51) made by HIROSE ELECTRIC CO., LTD.

On the flexible printed wiring board 101, ground lines and signal lines were formed. Specifically, one ground line was formed along one edge of the flexible printed wiring board 101 located in the width direction of the flexible printed wiring board 101, another ground line was formed along a center of the flexible printed wiring board 101 located in the width direction, and the other ground line was formed along the other edge of the flexible printed wiring board 101 located in the width direction. In addition, ten pairs of differential signal lines were formed on one side of the ground line formed along the center of the flexible printed wiring board 101, and ten pairs of differential signal lines were formed on the other side of the ground line formed along the center of the flexible printed wiring board 101.

The outer dimensions of the printed wiring board 502 were set at 50.0×70.0 mm, and the thickness of the printed wiring board 502 was set at 1.6 mm. The printed wiring board 502 used was a six-layer board.

The connector 103 used for connecting the flexible printed wiring board 101 and the printed wiring board 502 was a DF40C-70D5-0.4V(51) made by HIROSE ELECTRIC CO., LTD. The connector 503 used for connecting the printed wiring board 502 and the flexible printed wiring board 101 was a DF40C-70DP-0.4V(51) made by HIROSE ELECTRIC CO., LTD.

In addition, a resistor of 100Ω was disposed for termination, between two signal lines included in the differential signal lines formed on the printed wiring board 502.

The printed wiring boards 402 and 502 were electrically connected to the metal frame 750 via the metal members 1007 each having a height of 15.0 mm and a diameter of 6 mm. The metal frame 750 used was a metal plate having a size of 325×250 mm and a thickness of 1.0 mm.

For measuring the electromagnetic noise radiated from the flexible printed wiring board 101, a point located above a center of the flexible printed wiring board 101 by 5 mm was set as a measurement start point, and an electric field probe 1008 was positioned at the measurement start point. The electric field probe 1008 used was an EM-6997 made by Electro-Metrics Corporation. The electric field probe 1008 was moved from the measurement start point toward the printed wiring board 502 at intervals of 2 mm, and thereby twenty-three pieces of measurement data were obtained. The electric field probe 1008 was connected to a spectrum analyzer, E4440A, made by Keysight Technologies. In this manner, a potential difference, or a voltage value, between a detecting portion and the ground of the electric field probe 1008 was read, as measurement data, by using the spectrum analyzer; and the maximum value of voltage values of the twenty-three pieces of measurement data was determined as a measurement value.

Figure 12:
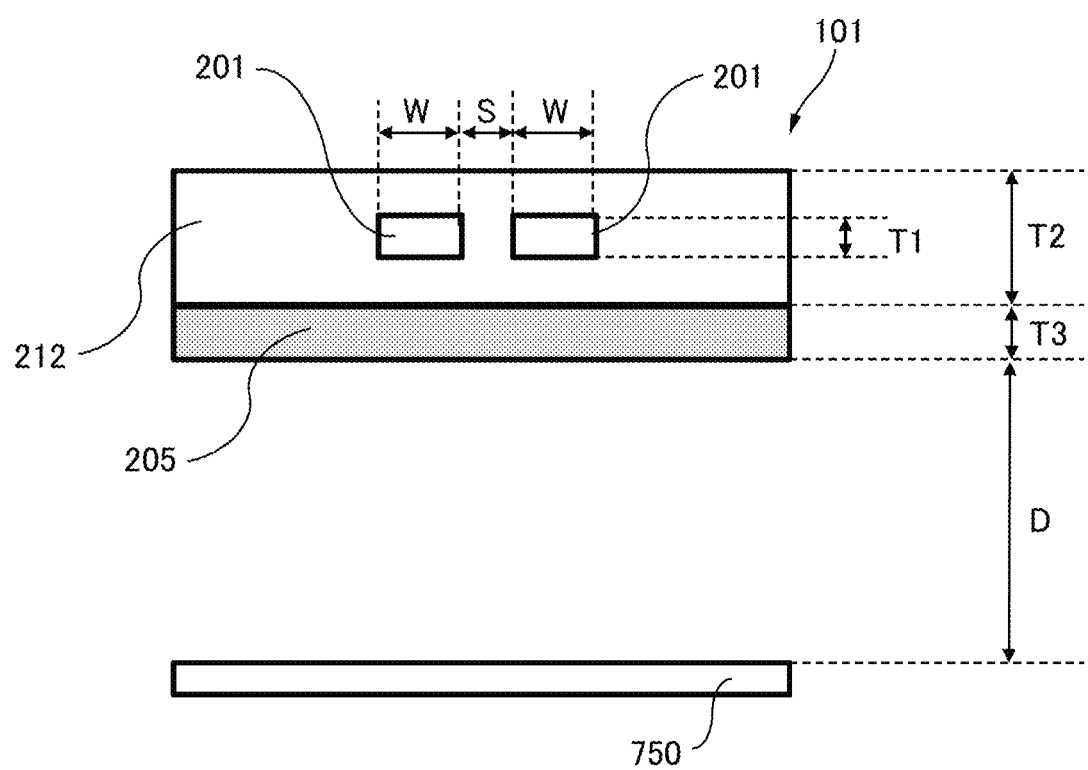
FIG. 12 is a schematic diagram illustrating a structure of a cross section of a flexible printed wiring board of the example.

FIG. 12 is a schematic diagram illustrating a structure of a cross section of the flexible printed wiring board 101 of the examples. The signal line 201 was made of copper. The insulating member 212 was made of polyimide. The line width W of each signal line 201 was set at 55 μm. A distance S between two differential signal lines 201 was set at 140 μm. A thickness T1 of each signal line 201 was set at 6 μm, and a thickness T2 of the insulating member 212 was set at 37.5 μm. In addition, a thickness T3 of the shield member 205 was set at 5 μm, and a distance D between the shield member 205 and the metal frame 750 was set at 15.0 mm. The relative dielectric constant of polyimide is 3.38.

The electromagnetic noise is caused by the common mode current that propagates along the loop path including a surface of the shield member 205 and a surface of the metal frame 750. For evaluating the electromagnetic noise, the effective relative dielectric constant $\varepsilon_r$ was calculated by using a simulator, HyperLynx, made by MACNICA, Inc. In the simulation, the shield member 205 was regarded as a signal line, and the metal frame 750 was regarded as a ground line. In addition, the distance D was set at 15.0 mm. By the way, the HyperLynx has the upper limit of input value of 10.0 mm. However, since the distance D between the shield member 250 and the metal frame 750 is sufficiently larger than the thickness T2+T3 of the cross section of the flexible printed wiring board 101, it can be considered that there is no difference between an effective relative dielectric constant $\varepsilon_r$ calculated by using a distance D of 10.0 mm and an effective relative dielectric constant $\varepsilon_r$ calculated by using a distance D of 15.0 mm. For this reason, an approximate value of the effective relative dielectric constant $\varepsilon_r$ was calculated by using the distance D of 10.0 mm, which is the upper limit value. For the same reason, in a case where the metal frame 750 is not disposed, an approximate value of the effective relative dielectric constant $\varepsilon_r$ can be calculated by using the distance D of 10.0 mm, which is the upper limit value.

The length L of the branch line 104 was calculated by using the equation (1). As a result, the effective relative dielectric constant $\varepsilon_r$ was 1.0008. For reducing the noise having a frequency of 5.300 GHz used in the WiFi (registered trademark) wireless communication, the length L of the branch line 104 is 14.2 mm. In addition, for reducing the noise having a frequency of 2.412 GHz used in the WiFi (registered trademark) wireless communication, the length L of the branch line 104 is 31.1 mm.

In Example 1, the flexible printed wiring board was designed for reducing the noise having a frequency of 5.300 GHz. In Example 1, the width of the branch line 104 was set at 1.5 mm. In addition, the branch line 104 was bent toward the printed wiring board 402 at a right angle at a position located away, by 4 mm, from the connecting portion between the branch line 104 and the shield member 205.

In Example 2, the flexible printed wiring board was designed for reducing the noise having a frequency of 2.412 GHz. In Example 2, the width of the branch line 104 was set at 1.5 mm. In addition, the branch line 104 was bent toward the printed wiring board 402 at a right angle at a position located away, by 4 mm, from the connecting portion between the branch line 104 and the shield member 205.

In Comparative Example 1, the branch line 104 was not disposed in the flexible printed wiring board. In Examples 1 and 2, the branch line 104 was disposed such that the open end 211 overlapped with one side of the printed wiring board 402.

TABLE 1 illustrates measurement values of noise voltage obtained in Comparative Example 1, Example 1, and Example 2.

|  | 2.412 GHz | 5.3 GHz |
| --- | --- | --- |
| COMPARATIVE EXAMPLE 1 | 70.3 dBμV | 60.2 dBμV |
| EXAMPLE 1 | 68.2 dBμV | 53.2 dBμV |
| EXAMPLE 2 | 59.2 dBμV | 55.5 dBμV |

In comparison between Comparative Example 1 and Example 1, at 5.3 GHz, the electromagnetic noise was reduced by 7 dBμV in Example 1, compared with the electromagnetic noise measured in Comparative Example 1. In comparison between Comparative Example 1 and Example 2, at 2.412 GHz, the electromagnetic noise was reduced by 11.1 dBμV in Example 2, compared with the electromagnetic noise measured in Comparative Example 1.

From the results illustrated in Table 1, it is understood that the frequency of the electromagnetic noise to be reduced can be set by adjusting the length of the branch line 104. If the electromagnetic noise having a plurality of different frequencies is required to be reduced, a plurality of branch lines having different lengths may be disposed.

Then, the orientation of the open end 211 of the branch line 104 that reduces the electromagnetic noise having a frequency of 5.3 GHz was changed for comparison. In Example 3, the width of the branch line 104 was set at 1.5 mm. In addition, the branch line 104 was bent toward a direction opposite to a direction in which the printed wiring board 402 was disposed, at a right angle at a position located away, by 4 mm, from the connecting portion between the branch line 104 and the shield member 205.

TABLE 2 illustrates measurement values of noise voltage obtained in Comparative Example 1, Example 1, and Example 3.

|  | 5.3 GHz |
| --- | --- |
| COMPARATIVE EXAMPLE 1 | 60.2 dBµV |
| EXAMPLE 1 | 53.2 dBµV |
| EXAMPLE 3 | 57.0 dBµV |

From the results illustrated in Table 2, it is understood that the electromagnetic noise is reduced more in the configuration in which the branch line 104 is bent toward the printed wiring board 402 that transmits a signal.

Then, the position of the branch line 104 that reduces the electromagnetic noise having a frequency of 5.3 GHz was changed for comparison. In Example 4, the branch line 104 was moved, by 10 mm, from the position of the open end 211 described in Example 1, toward the printed wiring board 402 or the −X direction. In Example 5, the branch line 104 was moved, by 10 mm, from the position of the open end 211 described in Example 1, toward a direction (or the +X direction) opposite to a direction in which the printed wiring board 402 was disposed.

TABLE 3 illustrates measurement values of noise voltage obtained in Example 4, Example 1, and Example 5.

|  | 5.3 GHz |
| --- | --- |
| EXAMPLE 4 | 52.7 dBµV |
| EXAMPLE 1 | 53.2 dBµV |
| EXAMPLE 5 | 56.3 dBµV |

From the results illustrated in Table 3, it is understood that the electromagnetic noise is reduced more in the configuration in which the branch line 104 is disposed such that the open end 211 of the branch line 104 overlaps with the printed wiring board 402.

The present invention is not limited to the above-described embodiments, and can be modified within a technical concept of the present invention. In addition, the effects described in the embodiments are merely examples of the most suitable effects produced by the present invention. Thus, the effects of the present invention are not limited to the effects described in the embodiments.

In the above-described embodiments, the description has been made for the camera which is one example of electronic devices, and in which the wireless communication unit is mounted. The present disclosure, however, is not limited to this. For example, the present invention can also be applied for an electronic apparatus in which a wireless communication unit is disposed in the vicinity of a flexible printed wiring board, or for an electronic apparatus in which no wireless communication unit is disposed.

In addition, although the description has been made in the above-described embodiments for the flexible printed wiring board disposed in an image pickup apparatus such as a digital camera, the present disclosure is not limited to this. For example, the present invention can also be applied for the rigid printed wiring boards 402, 502, and 602. In addition, the wiring board of the present invention can also be applied for electronic apparatuses that include a wiring board. Examples of the electronic apparatuses include mobile communication devices, such as smartphones, tablet PCs, and game machines, and wearable devices.

In addition, although the description has been made in the above-described embodiments for the case where the printed wiring board 402 is a rigid printed wiring board, the printed wiring board 402 may be a flexible printed wiring board. Similarly, although the description has been made in the above-described embodiments for the case where the printed wiring board 502 is a rigid printed wiring board, the printed wiring board 502 may be a flexible printed wiring board.

The present disclosure enables reduction of the level of the electromagnetic noise.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-97003, filed Jun. 10, 2021, and Japanese Patent Application No. 2022-72225, filed Apr. 26, 2022, which are hereby incorporated by reference herein in their entirety.

What is claimed is:

1. A wiring board comprising:
   a signal line including a first end connected to a signal transmitting side and a second end connected to a signal receiving side;
   a shield member including a main surface that overlaps with the signal line in a direction perpendicular to the main surface; and
   a branch line that is electrically connected to the shield member, the branch line including a leading end that is open,
   wherein the branch line is disposed closer to the first end of the signal line than to the second end of the signal line, and
   wherein the branch line is disposed such that the leading end of the branch line faces the signal transmitting side on which the first end of the signal line is positioned, wherein $$L = \frac{c}{4f\sqrt{\varepsilon_r}}$$

is satisfied, where L is a length of the branch line, f is a frequency, c is a speed of light, and $\varepsilon_r$ is an effective relative dielectric constant, and the frequency is in a range equal to or greater than 700 MHz and equal to or less than 66 GHz.

2. The wiring board according to claim 1, further comprising a ground line disposed adjacent to the signal line in a direction parallel with the main surface of the shield member.

3. The wiring board according to claim 2, wherein the ground line is electrically connected to the shield member, and
   wherein the branch line branches from the ground line.

4. The wiring board according to claim 2, wherein the branch line branches from a side of the ground line opposite to a side facing the signal line.

5. The wiring board according to claim 1, wherein the branch line branches from the shield member.

6. The wiring board according to claim 1, wherein one portion of the branch line includes the leading end and extends in a direction that extends along the signal line.

7. The wiring board according to claim 1, wherein the branch line is L-shaped.

8. The wiring board according to claim 1, wherein the frequency is a frequency in a 2.4 GHz band or a 5 GHz band.

9. The wiring board according to claim 1, wherein the wiring board is a flexible printed wiring board.

10. An electronic module comprising:
a wireless communication unit configured to perform wireless communication with an external apparatus;
a first printed wiring board which is the wiring board according to claim 9; and
a second printed wiring board to which the flexible printed wiring board is connected,
wherein a communication frequency of the wireless communication unit is a frequency equal to or greater than 700 MHz and equal to or less than 66 GHz.

11. The electronic module according to claim 10, wherein in a direction perpendicular to a main surface of the second printed wiring board, at least one portion of the branch line of the flexible printed wiring board overlaps with a ground trace of the second printed wiring board.

12. The electronic module according to claim 10, wherein at least one portion of the branch line includes the leading end of the branch line, and
wherein the at least one portion of the branch line has a length equal to or greater than half a length of the branch line.

13. An electronic apparatus comprising:
a housing; and
an electronic module disposed in the housing,
wherein the electronic module includes:
the wiring board according to claim 9; and
a printed wiring board to which the flexible printed wiring board is connected.

14. An electronic module comprising:
a first printed wiring board that is a flexible printed wiring board;
a second printed wiring board to which the flexible printed wiring board is connected; and
an electronic component mounted on the second printed wiring board and configured to transmit a signal to the signal line,
wherein the electronic component is an image sensor, and
wherein the first printed wiring board comprises:
a signal line including a first end connected to a signal transmitting side and a second end connected to a signal receiving side;
a shield member including a main surface that overlaps with the signal line in a direction perpendicular to the main surface; and
a branch line that is electrically connected to the shield member, the branch line including a leading end that is open,
wherein the branch line is disposed closer to the first end of the signal line than to the second end of the signal line, and
wherein the branch line is disposed such that the leading end of the branch line faces the signal transmitting side on which the first end of the signal line is positioned.

15. An electronic apparatus comprising:
a housing; and
the electronic module according to claim 14 and disposed in the housing,
wherein the electronic module further comprises an electronic unit to which the flexible printed wiring board is connected, the electronic unit being configured to perform data communication with an electronic component through the flexible printed wiring board.

16. The electronic module according to claim 14,
wherein the signal line is disposed in a first conductor layer;
wherein the shield member is disposed in a second conductor layer different from the first conductor layer; and
wherein the branch line branches from the shield member.

17. The electronic module according to claim 16, further comprising a ground line disposed in the first conductor layer adjacent to the signal line.

18. The electronic module according to claim 17, wherein the ground line is electrically connected to the shield member.

19. An electronic apparatus comprising:
a housing; and
an electronic module disposed in the housing,
wherein the electronic module comprises:
a first printed wiring board which is a flexible printed wiring board;
a second printed wiring board to which the flexible printed wiring board is connected;
an electronic unit to which the flexible printed wiring board is connected, the electronic unit being configured to perform data communication with an electronic component through the flexible printed wiring board; and
a wireless communication unit disposed in the housing, the wireless communication unit being configured to perform wireless communication with an external apparatus,
wherein the first printed wiring board comprises:
a signal line including a first end connected to a signal transmitting side and a second end connected to a signal receiving side;
a shield member including a main surface that overlaps with the signal line in a direction perpendicular to the main surface; and
a branch line that is electrically connected to the shield member, the branch line including a leading end that is open,
wherein the branch line is disposed closer to the first end of the signal line than to the second end of the signal line, and
wherein the branch line is disposed such that the leading end of the branch line faces the signal transmitting side on which the first end of the signal line is positioned.

20. The electronic apparatus according to claim 19, wherein $$L = \frac{c}{4f\sqrt{\varepsilon_r}}$$

is satisfied, where L is a length of the branch line, f is a frequency, c is a speed of light, and $\varepsilon_r$ is an effective relative dielectric constant, and the frequency is in a range equal to or greater than 700 MHz and equal to or less than 66 GHz.

* * * * *